United States Patent

Ishigaki et al.

[15] 3,660,679

[45] May 2, 1972

[54] TRANSISTOR CIRCUIT

[72] Inventors: Yoshio Ishigaki; Hajime Shinoda, both of Tokyo, Japan

[73] Assignee: Sony Corporation, Tokyo, Japan

[22] Filed: Apr. 24, 1970

[21] Appl. No.: 31,536

[30] Foreign Application Priority Data

May 1, 1969 Japan ....................................44/34194

[52] U.S. Cl. ..............................307/231, 307/237, 307/254, 330/30 D, 307/270

[51] Int. Cl. .........................................................HO3k 5/01

[58] Field of Search .........................307/270, 254, 231, 237; 330/69, 30 D

[56] References Cited

UNITED STATES PATENTS

| | | | |
|---|---|---|---|
| 3,435,359 | 3/1969 | Sennhenn | 330/30 D |
| 3,541,464 | 11/1970 | Slemmer | 330/30 D |
| 3,541,466 | 11/1970 | Yee | 330/30 D |
| 3,241,078 | 3/1966 | Jones | 330/30 D |
| 3,546,485 | 12/1970 | Davis | 307/254 |

*Primary Examiner*—John S. Heyman
*Assistant Examiner*—Harold A. Dixon
*Attorney*—Hill, Sherman, Meroni, Gross & Simpson

[57] ABSTRACT

A transistor circuit having a pair of transistors connected in the manner of a differential amplifier connection and a pair of diodes respectively connected with the transistors, which diodes constituting a series connection between the pair of transistors.

A control element is connected between the pair of diodes in order to give switching operation to the diodes.

7 Claims, 6 Drawing Figures

INVENTOR.
YOSHIO ISHIGAKI
HAJIME SHINODA
BY Hill, Sherman, Meroni, Gross & Simpson ATTORNEYS INVENTOR
YOSHIO ISHIGAKI
HAJIME SHINODA
BY Hill, Sherman, Meroni, Gross & Simpson ATTORNEYS

TRANSISTOR CIRCUIT

BACKGROUND OF THE INVENTION

1. Field of the Invention

This invention relates to a transistor circuit, and more particularly to a novel circuit which employs a pair of transistors and diode elements and is of particular utility when employed in integrated circuits.

2. Description of the Prior Art

In recent years a demand has widely sprung up for integration of a transistor circuit but its inductance and capacitance elements are deterrent to the integration of the circuit as is well-known in the art. It has been proposed to form a circuit only with transistors, diodes, resistors and so on which, however, performs the same function as that of a circuit including the inductance and capacitance elements. At the present stage of the art, however, this usually introduces considerable complexity in the circuit construction.

SUMMARY OF THE INVENTION

In accordance with this invention a transistor circuit is made up of only transistors, diodes and resistors including at least one pair of transistors, and one pair of diodes, which is simply constructed and well suited for integration and can be employed when required to achieve different functions. Namely, the transistor circuit is adapted to operate in two modes such that the pair of transistors are controlled by control means utilizing the pair of diodes to constitute and not to constitute a differential amplifier relative to an input signal to the transistors. Consequently, this invention is of particular utility when employed in a gate circuit, a switching circuit, a phase detector circuit such as a color demodulator circuit for color television signals and the like.

Accordingly, one object of this invention is to provide a transistor circuit which is suitable for integration and simple in construction.

Another object of this invention is to provide a transistor circuit which is capable of performing a plurality of different functions.

Still another object of this invention is to provide a transistor circuit which includes at least one pair of transistors and means for controlling a current flowing to the pair of transistors and is designed to operate in two modes such that the pair of transistors constitute and do not constitute a differential amplifier.

Other objects, features and advantages of this invention will become apparent from the following description taken in conjunction with the accompanying drawings.

DESCRIPTION OF THE PREFERRED EMBODIMENTS

With reference to the drawings a description will hereinafter be given of one example of a transistor circuit of this invention.

Figure 1:
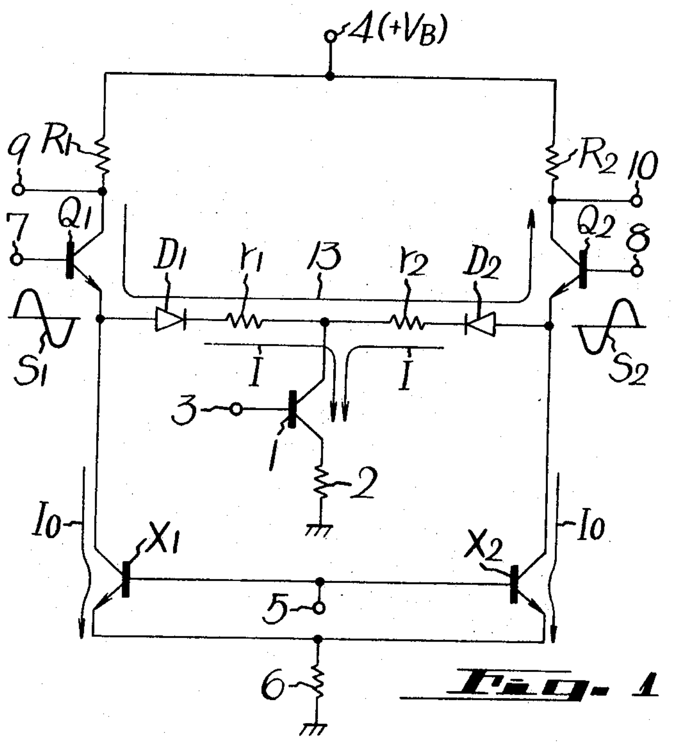
FIG. 1 is a connection diagram showing one example of a transistor circuit of this invention.

In FIG. 1 reference characters $Q_1$ and $Q_2$ indicate first and second transistors, the emitters of which are respectively connected to the collectors of transistors $X_1$ and $X_2$ serving as constant-current sources. Further, the emitters of the first and second transistors $Q_1$ and $Q_2$ are respectively connected to the collector of a common control transistor 1 through diodes $D_1$ and $D_2$ and resistors $r_1$ and $r_2$. The transistor 1 has the emitter grounded through a resistor 2 and the base connected to a control signal input terminal 3. The collectors of the first and second transistors $Q_1$ and $Q_2$ are respectively connected to a power source terminal 4 through load resistors $R_1$ and $R_2$. The bases of the transistors $X_1$ and $X_2$ serving as constant-current sources are supplied with a fixed bias voltage from a terminal 5 and their emitters are grounded through a common resistor 6. These transistors $X_1$ and $X_2$ are adapted to operate in their collector saturation regions so that a change in their collector potentials causes substantially no change in their collector currents.

The transistors $Q_1$ and $Q_2$ are both held in the on state. In the event that an input signal $S_1$ is supplied to the base of the first transistor $Q_1$ through an input terminal 7 and an input signal $S_2$ opposite in sense to the signal $S_1$ is supplied to the base of the second transistor $Q_2$ through an input terminal 8, when the level of a control signal supplied to the control signal input terminal 3 is lower than a predetermined value and the control transistor 1 is in the off state, no current flows to the both diodes $D_1$ and $D_2$ and, further, even if the emitter potentials of the transistors $Q_1$ and $Q_2$, that is, the collector potentials of the transistors $X_1$ and $X_2$ are changed by the signals $S_1$ and $S_2$, substantially no change is caused in the collector currents of these transistors $X_1$ and $X_2$ to cause substantially no variation in the currents flowing to the loads $R_1$ and $R_2$. Assuming that the transistors $Q_1$, $Q_2$ and $X_1$, $X_2$ respectively have the same characteristics and that the resistors $R_1$ and $R_2$ have the same resistance value Ro, collector DC currents Io of the same value flow in the transistors $X_1$ and $X_2$. Consequently, when the control transistor 1 is in the off state as above described, DC voltages such as indicated by straight lines 11 and 12 is FIGS. 2A and 2B, which have been lowered from the voltage $V_B$ at the terminal 4 by a voltage drop corresponding to the resistance value Ro due to the aforementioned current Io, are derived at output terminals 9 and 10 respectively connected to the collectors of the first and second transistors $Q_1$ and $Q_2$. Namely, in this case the signals $S_1$ and $S_2$ are not transmitted to the output terminals 9 and 10 and the transistors $Q_1$ and $Q_2$ do not constitute a differential amplifier.

Where the level of the control signal supplied to the control signal input terminal 3 exceeds the predetermined value and the control transistor 1 is in the on state, the diodes $D_1$ and $D_2$ are conductive. Accordingly, in this case one portion of the collector current of each of the transistors $Q_1$ and $Q_2$ flows in the transistor 1 through the diodes $D_1$ and $D_2$ respectively, so that signal currents due to the input signals $S_1$ and $S_2$ flow in these diodes $D_1$ and $D_2$. Namely, in the positive half cycle of the input signal $S_1$ and consequently in the negative half cycle of the input signal $S_2$, the current flowing in the diode $D_1$ increases and the current flowing in the diode $D_2$ decreases, with the result that the signal current flows in a direction indicated by an arrow 13. While, in the negative half cycle of the input signal $S_1$, namely in the positive half cycle of the input signal $S_2$ the signal current flows in a reverse direction. As a result of this, the load resistors $R_1$ and $R_2$ derive therefrom voltage variations caused by such signal currents and the input signals $S_1$ and $S_2$ are amplified and derived at the output terminals 9 and 10. Namely, if the diodes $D_1$ and $D_2$ are of the same characteristics and the resistors $r_1$ and $r_2$ are of the same resistance value, there are respectively derived at the output terminals 9 and 10 output signals 16 and 17 varying about DC levels indicated by broken lines 14 and 15 in FIGS. 2A and 2B which have been lowered from the voltage values indicated by the straight lines 11 and 12 in the figure by voltage drops of the resistors $R_1$ and $R_2$ due to the DC current I flowing in the diodes $D_1$ and $D_2$. In this case, the output signal 16 derived at the terminal 9 is opposite in sense to the input signal $S_1$ and the output signal 17 derived at the terminal 10 is of the same polarity as that of the input signal $S_1$.

If the control transistor 1 is adapted to operate in such a region that its collector current varies with the level of the control signal supplied to its base not in a region in which the collector current is saturated, it is possible that the internal resistances of the diodes $D_1$ and $D_2$ in its conducting condition in the forward direction is altered by changing the control signal level to vary the collector current. Accordingly, the output signal current I can be changed by changing the level of the control signal supplied to the terminal 3 and the gain of the differential amplifier can be altered. Consequently, an automatic gain control circuit can be provided by supplying the base of the control transistor 1, namely the terminal 3 with a signal voltage corresponding to the output signal level.

Figures 2A, 2B, 2C:
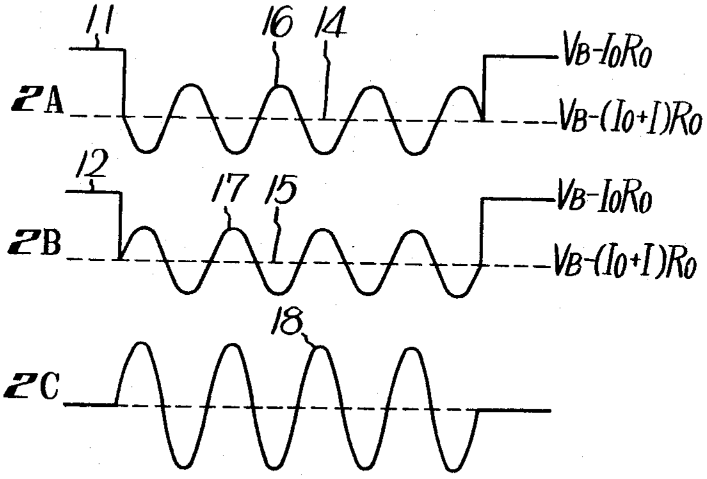
FIG. 2 is a waveform diagram for explaining the transistor circuit exemplified in FIG. 1.
Figure 3:
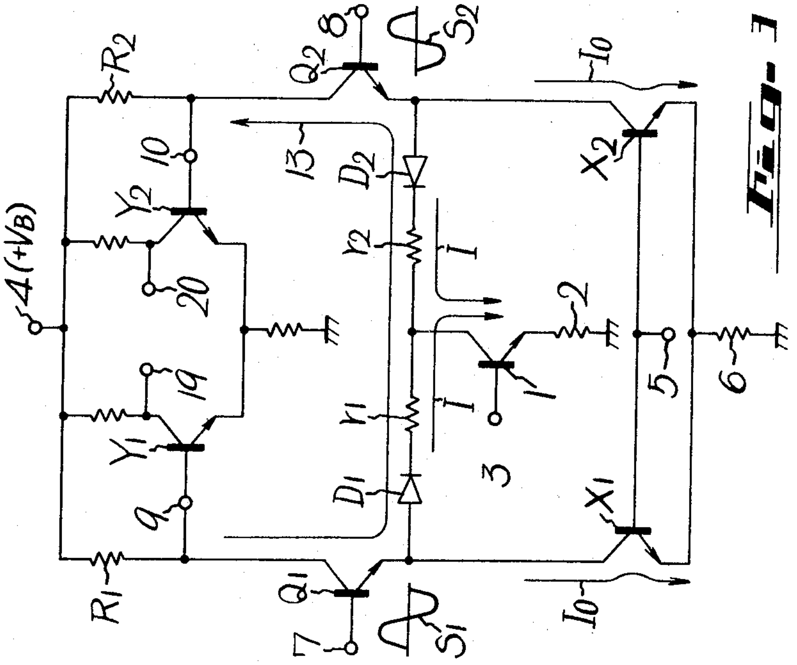

As is apparent from FIGS. 2A and 2B, the DC levels appearing at the output terminals 9 and 10 are respectively different in the cases where the control transistor 1 is in the on and off states, namely where the transistors $Q_1$ and $Q_2$ serve and do not serve as a differential amplifier but the difference between the output voltages derived from the terminals 9 and 10 is picked up as an output, the DC level of the output is held constant irrespective of whether the transistor 1 is in the on or off state, namely whether the transistors $Q_1$ and $Q_2$ function as a differential amplifier or not and further the output signals 16 and 17 derived at the terminals 9 and 10 are opposite in sense to each other, so that the level of the output signal 18 produced in the case of the transistors $Q_1$ and $Q_2$ serving as a differential amplifier is twice those of the output signals 16 and 17 as depicted in FIG. 2C. In the event that the output is derived from between the terminals 9 and 10 as above described, it is possible to produce a difference between the output voltages derived from the terminals 9 and 10 and hence to obtain an output having a constant DC level as shown in FIG. 2C by further supplying the output signals obtained at the terminals 9 and 10 to the bases of transistors $Y_1$ and $Y_2$ forming a differential amplifier and leading out outputs from terminals 19 and 20 connected to the collectors of the transistors $Y_1$ and $Y_2$ as illustrated in FIG. 3.

Figure 4:
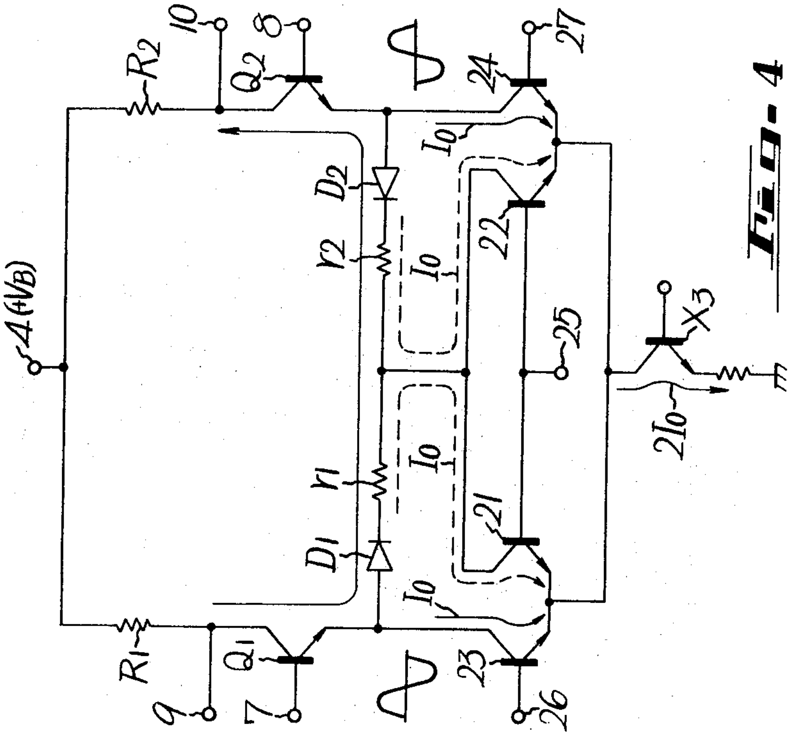
FIGS. 3 and 4 are connection diagrams illustrating modified forms of the transistor circuit of this invention.

With a control circuit being formed as shown in FIG. 4, an output of a constant DC level can be derived from between output terminals 9 and 10. In FIG. 4 elements similar to those in FIGS. 1 and 3 are identified by the same reference numerals and characters. In the present example the control circuit is formed with transistors 21 and 22 in place of the control transistors 1 used in the examples of FIGS. 1 and 3, the emitters of the transistors 21 and 22 being respectively connected to those of transistors 23 and 24 whose base terminals 26 and 27 are supplied with a fixed bias voltage and which operates in its collector saturation region, the collectors of the transistors 21 and 22 being interconnected and connected to the connection point of the resistors $r_1$ and $r_2$ and the bases being interconnected and connected to a control signal input terminal 25. Further, the emitters of the transistors 21, 23 and 22, 24 are connected together to the collector of a transistor $X_3$ forming a constant-current circuit of 2*Io*. With such connections, when the level of a control signal supplied to the control signal input terminal 25 is lower than a predetermined value and the transistors 21 and 22 are in the off state, the transistors 23 and 24 are in the on state and a current *Io* flows in the resistor $R_1$, the transistor $Q_1$ and the transistor 23 and in the resistor $R_2$, the transistor $Q_2$ and the transistor 24 but no current flows in the diodes $D_1$ and $D_2$, with the result that transistors $Q_1$ and $Q_2$ do not form a differential amplifier and the signals $S_1$ and $S_2$ are not transmitted to the terminals 9 and 10. At the terminals 9 and 10 are derived DC voltages $V_B$-IoRo which are lower than the voltage $V_B$ by a voltage drop IoRo of the resistors $R_1$ and $R_2$ due to the current *Io*.

While, when the level of the control signal supplied to the control signal input terminal 25 exceeds the predetermined value, the control transistors 21 and 22 are in the on state. In this case the voltage level of the control signal supplied to the control signal input terminal 25, namely to the transistors 21 and 22 is selected higher than the fixed bias voltage supplied to the bases of the transistors 23 and 24, so that the impedances of the transistors 21 and 22 are extremely low. Consequently, the impedances of the transistors 23 and 24 are far higher than those of the transmission paths from the emitters of the transistors $Q_1$ and $Q_2$ to those of the transistors 21 and 22 and substantially no currents flow through the transistors 23 and 24 Namely, the currents Io respectively flow to the transistor 21 through the resistor $R_1$, the transistor $Q_1$, the diode $D_1$ and the resistor $r_1$ and to the transistor 22 through the resistor $R_2$, the transistor $Q_2$, the diode $D_2$ and the resistor $r_2$ as indicated by broken lines. Accordingly, in this case, too, the DC voltages $V_B$-IoRo are derived at the terminals 9 and 10. Further, the currents *Io* flow in the diodes $D_1$ and $D_2$, too, to put them in the on state, so that the transistors $Q_1$ and $Q_2$ form a differential amplifier and the signals $S_1$ and $S_2$ are transmitted to the terminals 9 and 10 to be superimposed on the DC levels $V_B$-IoRo. As a result of this, a signal is produced which does not vary in its DC level as shown in FIG. 2C.

Although the foregoing description has been made in connection with case where the input signals of opposite polarities are supplied to the first and second transistors $Q_1$ and $Q_2$, the input signal need not always be supplied to the second transistor $Q_2$. In this case the signal current due to the signal $S_2$ does not flow, so that the level of the signal current and accordingly the output signal is one-half that above mentioned. In the case of deriving the output from the terminal 9 the load resistor $R_2$ may be left out and in the case of deriving the output from the terminal 10 the load resistor $R_1$ may be dispensed with. Further, the constant-current sources need not always be made up of transistors but may be formed with, for example, resistors of a great value. The resistors $r_1$ and $r_2$ may be left out in some cases.

By controlling conduction and nonconduction of the control transistors with the control signal the transistor circuit of this invention above described can be caused to achieve gate action relative to the input signal in two modes to form and not to form a differential amplifier, and consequently this invention circuit is very suitable for use as a gate circuit or a switching circuit. Further, when the transistor circuit is operated as the differential amplifier its gain can be controlled by the control signal, so that the circuit of this invention can be employed as an automatic gain control circuit. In addition, where a composite color signal subcarrier consisting of color subcarriers of 3.58 MHz which are respectively amplitude modulated by different color signals and are out of phase from each other is applied as an input signal to the input terminals and reference subcarriers of 3.58 MHz which are respectively in phase with the color subcarriers are supplied as control signal, the input color signal subcarrier can be gated by the reference subcarriers, so that a color demodulator circuit can be formed. Accordingly, the circuit of this invention can be used as a phase detector circuit or a synchronous detector circuit and hence is applicable to various uses. Further, since this invention circuit can be made up of transistors, diodes and resistors, its integration can be effected easily and effectively.

In the foregoing examples NPN-type transistors are employed but may be replaced with PNP-type transistors. Further, field effect transistors may be used, in which case they may be connected in exactly the same manner as in the foregoing, if the base, emitter and collector of the NPN- or PNP-type transistors are respectively regarded as the gate, source and drain.

It will be apparent that many modifications and variations may be effected without departing from the scope of the novel concepts of this invention.

We claim as our invention:

1. A transistor circuit comprising: a pair of transistors each having first, second and third electrodes, at least one of said first electrodes being supplied with an input signal, means for deriving an output signal from at least one of said second electrodes, a constant current source, means for coupling said constant current source to said third electrodes, a semiconductor device control switching means, a pair of current paths in parallel with the constant current source with each of said current paths including a coupling from respective ones of said third electrodes to said semiconductor device control switching means, and at least one diode in each of said pair of current paths.

2. A transistor circuit as claimed in claim 1 wherein said first, second and third electrodes are respectively a base, a collector and an emitter.

3. A transistor circuit as claimed in claim 1 wherein said output signal deriving means is an impedance element connected between said second electrode and a voltage source.

4. A transistor circuit as claimed in claim 1 wherein said pair of diodes are connected in series to each other with opposite polarities.

5. A transistor circuit as claimed in claim 1 wherein said control means includes a transistor supplied with the control signal.

6. A transistor circuit as claimed in claim 1 wherein a second pair of transistors forming a differential amplifier are connected between output terminals of the first-mentioned pair of transistors.

7. A transistor circuit as claimed in claim 1 wherein said control means comprises a pair of transistors connected between said pair of diodes.

* * * * *